(12) United States Patent
Hamond et al.

(10) Patent No.: US 9,813,077 B2
(45) Date of Patent: Nov. 7, 2017

(54) ASYNCHRONOUS ELECTRICAL CIRCUITRY TECHNIQUES FOR PRODUCING STATIONARY CARRIER SIGNAL TO ENCODE INPUT SIGNAL AMPLITUDE INTO OUTPUT SIGNAL TIME-SEQUENCE INFORMATION

(71) Applicant: Indice Semiconductor Inc., Tualatin, OR (US)

(72) Inventors: James Hamond, Lake Oswego, OR (US); Robert D. Batten, Portland, OR (US)

(73) Assignee: Indice Semiconductor Inc., Tualatin, OR (US)

( * ) Notice: Subject to any disclaimer, the term of this patent is extended or adjusted under 35 U.S.C. 154(b) by 0 days.

(21) Appl. No.: 15/323,038

(22) PCT Filed: Jun. 30, 2015

(86) PCT No.: PCT/US2015/038690
§ 371 (c)(1),
(2) Date: Dec. 29, 2016

(87) PCT Pub. No.: WO2016/004122
PCT Pub. Date: Jan. 7, 2016

(65) Prior Publication Data
US 2017/0134040 A1    May 11, 2017

(30) Foreign Application Priority Data
Jun. 30, 2014 (AU) .............................. 2014902511

(51) Int. Cl.
*H03M 3/00* (2006.01)

(52) U.S. Cl.
CPC ............... *H03M 3/50* (2013.01); *H03M 3/32* (2013.01); *H03M 3/39* (2013.01); *H03M 3/402* (2013.01)

(58) Field of Classification Search
CPC ............ H03M 3/50; H03M 3/32; H03M 3/39; H03M 3/402
(Continued)

(56) References Cited

U.S. PATENT DOCUMENTS 4,479,142 A * 10/1984 Buschman ............ H04J 3/1623
370/465
7,176,819 B1    2/2007 Swerlein et al.
(Continued)

OTHER PUBLICATIONS

International Search Report and Written Opinion, PCT/US2015/038690, dated Sep. 29, 2015.
(Continued)

*Primary Examiner* — Brian Young
(74) *Attorney, Agent, or Firm* — Stoel Rives LLP; Robert R. Teel

(57) ABSTRACT

Asynchronous electrical circuitry produces a stationary carrier signal and encodes a system input signal amplitude into output signal time-sequence information by establishing at a digitizer an operating point value as an average amplitude of the system input signal. It applies to the digitizer a multi-component digitizer-input signal corresponding to a sum of a passband signal component and a feedback signal component to produce a pulse-width modulated digitizer output signal representing the system input signal. An asynchronous time delay is introduced to produce the pulse-width modulated system output signal. The circuitry performs digital-to-analog conversion (DAC) to the pulse-width modulated system output signal to produce a DAC output signal. The DAC output signal or its summation with the passband signal component is integrated to produce the
(Continued)

feedback signal component. Additional, multiple-order embodiments include sequential feedback paths or carrier-shaping functions.

17 Claims, 15 Drawing Sheets

(58) Field of Classification Search
USPC .................................................. 341/143, 51
See application file for complete search history.

(56) References Cited

U.S. PATENT DOCUMENTS

| | | | |
|---|---|---|---|
| 7,304,965 B2* | 12/2007 | Back | H04B 1/7083 370/310 |
| 9,560,390 B2* | 1/2017 | Niesen | H04N 21/23106 |
| 2002/0196173 A1 | 12/2002 | Yamamoto | |
| 2010/0045499 A1 | 2/2010 | Rivoir | |
| 2010/0074368 A1 | 3/2010 | Karthaus et al. | |
| 2014/0125504 A1 | 5/2014 | Braswell et al. | |

OTHER PUBLICATIONS

Lazar,Aurel A. et al.,"Time Encoding of Bandlimited Signals, an Overview", http://citeseerx.ist.psu.edu/viewdoc/download?doi=10.1.1.59.9578&rep=rep1&type=pdf, Nov. 5, 2005,18 pages.

Wei,Dazhi et al.,"An Asynchronous Delta-Sigma Converter Implementation", http://www.cnel.ufl.edu/~vaibhav/_private/publications/asynchronous_data_converters.pdf, 2006, 4 pages.

* cited by examiner

ASYNCHRONOUS ELECTRICAL CIRCUITRY TECHNIQUES FOR PRODUCING STATIONARY CARRIER SIGNAL TO ENCODE INPUT SIGNAL AMPLITUDE INTO OUTPUT SIGNAL TIME-SEQUENCE INFORMATION

RELATED APPLICATIONS

This application is a National Stage of International Application No. PCT/US2015/038690, filed Jun. 30, 2015, which claims priority benefit of Australian Provisional Patent Application No. 2014902511, titled "A Circuit," filed Jun. 30, 2014 both of which are hereby incorporated by reference.

TECHNICAL FIELD

The present disclosure relates generally to electronic circuits and, more particularly, to electronic circuits for generating pulse-width modulated waveforms fog use in, for example, audio-frequency amplifiers, regulated power supplies, digital-to-analog converters (DACs), analog-to-digital converters (ADCs), and encoding applications.

BACKGROUND INFORMATION

Delta-sigma (DS) converters have been around for many years, and are a dominant form of converters used for high precision conversion of analog-to-digital signals and vice versa. Converters such as DS converters provide high dynamic range and flexibility in converting low bandwidth input signals. Delta-sigma (or sigma-delta) modulation is a signal processing method. It can be used, for example, to encode analog signals into digital signals as found in an ADC.

In a conventional ADC, an analog signal is integrated, or sampled, with a sampling frequency and subsequently quantized in a multi-level quantizer into a digital signal. This process introduces quantization error noise. Rather than quantizing an input signal's value, the first step in a delta-sigma modulation is to encode a change in an input signal (i.e., its "delta"). The result is a stream of pulses, as opposed to a stream of numbers as is the case with pulse code modulation (PCM). The next step in delta-sigma modulation is to then improve the accuracy of the modulation by passing the digital output through a one-bit DAC and adding (hence, a "sigma") the resulting analog signal to the input signal, thereby reducing the error introduced by the delta-modulation.

This technique has found increasing use in modern electronic components such as converters, frequency synthesizers, switched-mode power supplies and motor controllers, primarily because of its high precision.

Both ADCs and DACs can employ delta-sigma modulation. A delta-sigma ADC first encodes an analog signal using high-frequency delta-sigma modulation, and then applies a digital filter to form a higher-resolution but lower sample-frequency digital output. On the other hand, a delta-sigma DAC encodes a high-resolution digital input signal into a lower-resolution but higher sample-frequency signal that is mapped to voltages, and then smoothed with an analog filter. In both cases, the temporary use of a lower-resolution signal simplifies circuit design and improves efficiency.

A standard delta-sigma converter circuit according to the prior art is schematically depicted in FIG. 1. Delta-sigma encoding is used in applications where high bit precision but limited frequency response is desired. To achieve this, the converter may have several feedback loops (that is, several integrator and summer junctions) and may have a multi-bit DAC. A delta-sigma converter oversamples the input signal and shapes the noise spectrum so that the modulator appears to be a high-pass filter for the noise and a low-pass filter for the input signal.

Continuous time delta-sigma converters however, have shortcomings. High frequency edge signals limit the operating frequency before noise and errors become dominant. Delta-sigma systems are typically limited in oversampling ratios. Delta-sigma systems typically employ multiple order, highly complex configurations to produce high quality results. These high quality results are achieved by introducing complexity into the system and hence increasing costs as component counts rise. In addition, the high quality results are achieved at the expense of power and extended group delay. These converters also have input overload limitations related to the output levels of the DAC. A system of three or more orders is likely to result in instability.

The frequency of operation of these systems is generally limited by the response of the differentiating (subtraction) hardware, typically an amplifier module. To overcome this, alternatives and modifications have been adopted including using lower frequency clocks, multi-bit DACs within the feedback loop with higher order digital filters and higher order modulators to achieve improved precision and noise performance. It is not uncommon to have five orders in a system. However, such modifications can cause the system to compromise intermodulation distortion (IMD), linearity, power dissipation, and group delay. Higher order modulators may not be completely stable.

Embodiments of the present disclosure provide circuits for generating pulse-width modulated waveforms that are particularly suitable for, but not limited to, controlling the known class-D circuit. Furthermore, embodiments of the present disclosure aim to ameliorate some of the disadvantages of the prior art

SUMMARY OF THE DISCLOSURE

According to a first aspect of the present disclosure there is provided a circuit for generating a series of pulses in response to a first signal, the circuit comprising: a first integrator having an input and an output, wherein the input is arranged to receive the first signal; a primary summing node for combining two or more signals, wherein one of the two or more signals is derived from the output of the first integrator; a digitizer having two inputs and an output, wherein one input of the digitizer receives an output signal from the primary summing node and the other input receives a reference signal, and wherein the digitizer generates an output signal comprising a series of pulses; a time delay element arranged to receive the output signal from the digitizer so as to produce a delayed output signal; and a primary feedback loop comprising a DAC and a second integrator, wherein an input of the DAC receives the delayed output signal from the time delay element and the second integrator receives an output signal from the DAC, and wherein the second integrator has its output signal connected to a second input of the summing node.

The circuit may further comprise: a secondary integrator having an input and an output, wherein the input is arranged to receive the signal from the primary summing node; and a secondary summing node for combining two or more signals, wherein one of the two or more signals is the output of the secondary integrator, a secondary feedback loop comprising a DAC and an integrator, wherein an input of the DAC receives the delayed output signal from the time delay element and the integrator receives an output signal from the DAC, and wherein the integrator has its output signal connected to a second input of the secondary summing node.

The circuit as described above may comprise: a plurality of feedback loops, and wherein each feedback loop comprises a DAC and an integrator; an input of each DAC receives the delayed output signal from the time delay element and each integrator receives an output signal derived from the DAC in its feedback loop; and each integrator has its output signal connected to an input of the primary or secondary summing node.

One of the DACs may be shared by or across two or more of the feedback loops. That is, there may be one DAC that operates over two feedback loops.

The reference signal may be a non-oscillating signal. Alternatively, the reference signal may be a signal which is the compliment of the output signal from either the primary or secondary summing node.

The time delay element may provide a continuously configurable time delay which allows for shaping of a signal to achieve a desired outcome.

The circuit may further include a single component which is a multi-input integrator which sums and integrates the first signal and the one or more signals input into the primary summing node. In addition, the circuit may also further include a multi-input integrator component which sums and integrates an input and one or more feedback signals in the circuit.

The circuit may further include a half-bridge configuration. The circuit may include a differential and balanced input.

According to another aspect of the present disclosure there is provided a regulated power supply including a circuit as described above.

According to yet another aspect of the present disclosure there is provided an amplifier including a circuit as described above wherein an output signal from the amplifier is derived from the output signal of one of the DACs.

The amplifier may further comprise a filter, wherein the filter receives as its input the output of the DAC; and the output signal from the amplifier is the output signal of the filter.

The amplifier may further comprise another feedback loop having an integrator, wherein the integrator receives a signal derived from the filter and the integrator outputs a signal which is received by the primary summing node.

Additional aspects and advantages will be apparent from the following detailed description of embodiments, which proceeds with reference to the accompanying drawings.

DETAILED DESCRIPTION OF EMBODIMENTS

Figure 1:
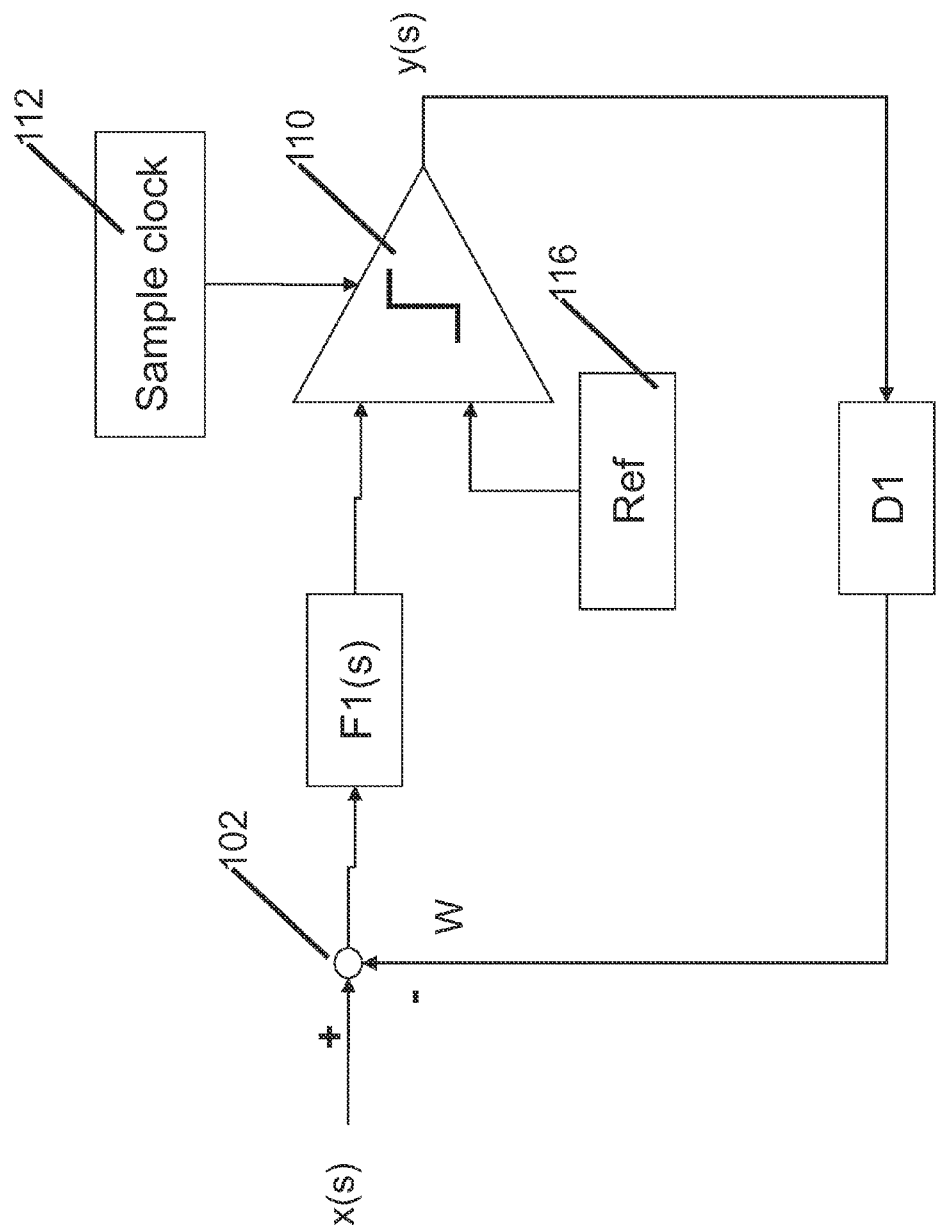
FIG. 1 shows a schematic block diagram of a prior art delta-sigma system.

Embodiments of the present disclosure are generally described with reference to the accompanying drawings. These embodiments are given by way of illustration only and other embodiments of the disclosure are possible. Consequently, any particularity of the accompanying drawings is not to be understood as superseding the generality of the following detailed description, By way of background, FIG. 1 shows a simple schematic block diagram of a prior art first order, synchronous delta-sigma ADC. The input signal x(s) is input to the converter via a delta node 102. The signal then passes through an integrator F1. The output signal of integrator F1 is an input to a digitizer 110.

The digitizer 110 produces a binary representation of the state of its inputs. For example, the digitizer 110 acts as a one-bit comparator, such that the output y(s) of the digitizer 110 is either a digital logic value of one or zero, depending on which of its inputs receives a higher input signal amplitude (e.g., whether the output of integrator F1 or a reference voltage 116 is greater). As shown in FIG. 1, the value output by the digitizer 110 is gated by a sample clock 112.

The digitizer output y(s) is fed back to the input of the delta node 102 via a one-bit DAC D1. The feedback loop forces the average of the signal W output from D1 to be equal to the input signal x(s).

The disadvantage of this system is having a node where a signal is subtracted from another signal. Subtraction is typically performed by a differentiating circuit in the form of, for example, an operational amplifier, which adds complexity and cost to the device shown in FIG. 1.

Figure 2:
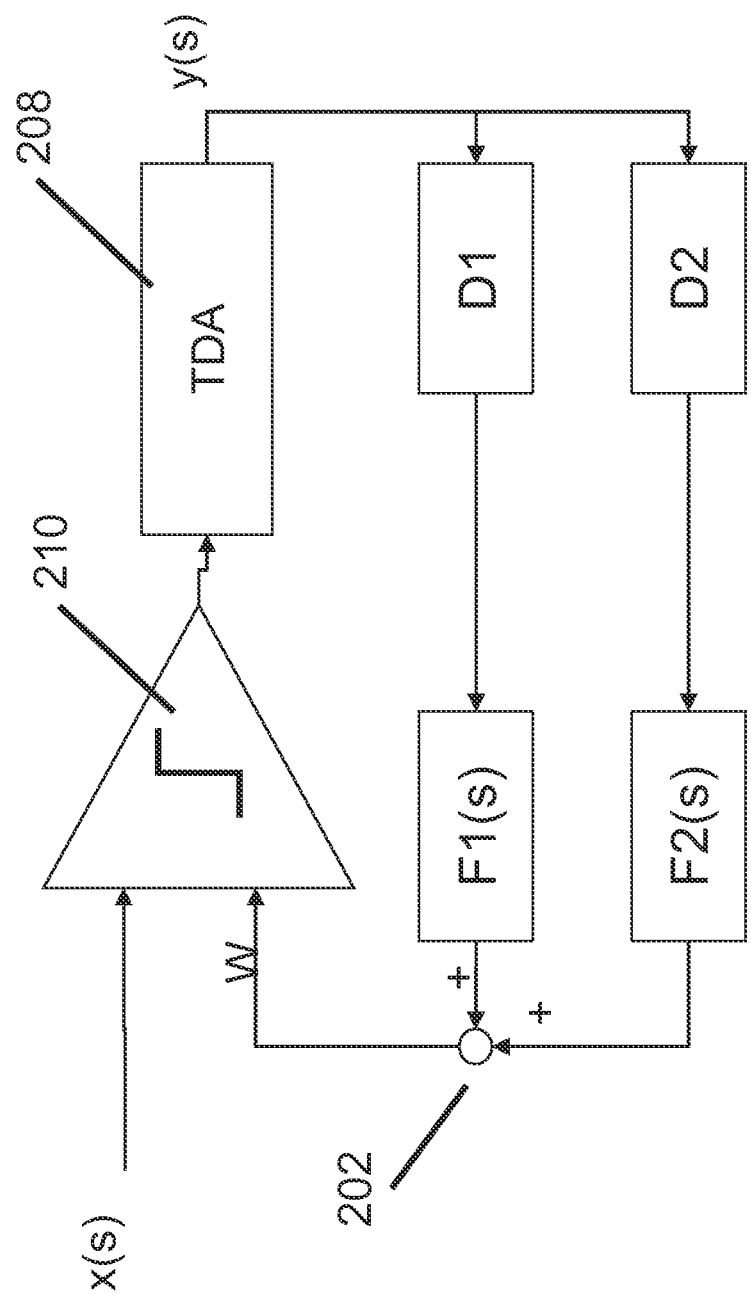
FIG. 2 shows a schematic block diagram of another prior art system.

In the prior art circuit shown in FIG. 2, a signal x(s) is compared with a sigma feedback path signal, W, by a digitizer 210. Output y(s) is the digitizer's output signal delayed by a set amount 't' which is controlled by the time-delay asynchronous (TDA) block 208. D1 and D2 are one bit DACs. F1 is a lossy integrator with a roll-off frequency set above the passband but well below the switching frequency, which heavily attenuates the carrier signal. F2 is a filter which shapes the carrier signal, thereby improving total harmonic distortion and noise (THD+N) in the system.

In this system the digitizer 210 has two inputs, the first is an input signal x(s), the other is a feedback signal, W, which is the sum of two individual feedback signals. The output of the digitizer 210 is delayed by the TDA block 208. This output signal y(s) is processed by each DAC, D1 and D2, and then modified by, respectively, F1 and F2. The resulting output signals are summed 202 and the resulting signal W is input to the digitizer 210. The digitizer 210 ensures that the integrator F1 tracks the input signal x(s). The carrier signal component in the integrator F1 will cause the output of the digitizer 210 to change state as the digitizer's input signal W rises above or below the input signal x(s). The output signal of the digitizer 210 combined with the delay from the TDA block 208 is input to the DACs, D1 and D2, setting the frequency of operation. The signal output from filter F2 becomes larger as the signal approaches the rail voltage, causing the gain of the system to increase slightly, compensating for other non-ideal features in the system.

Figure 3:
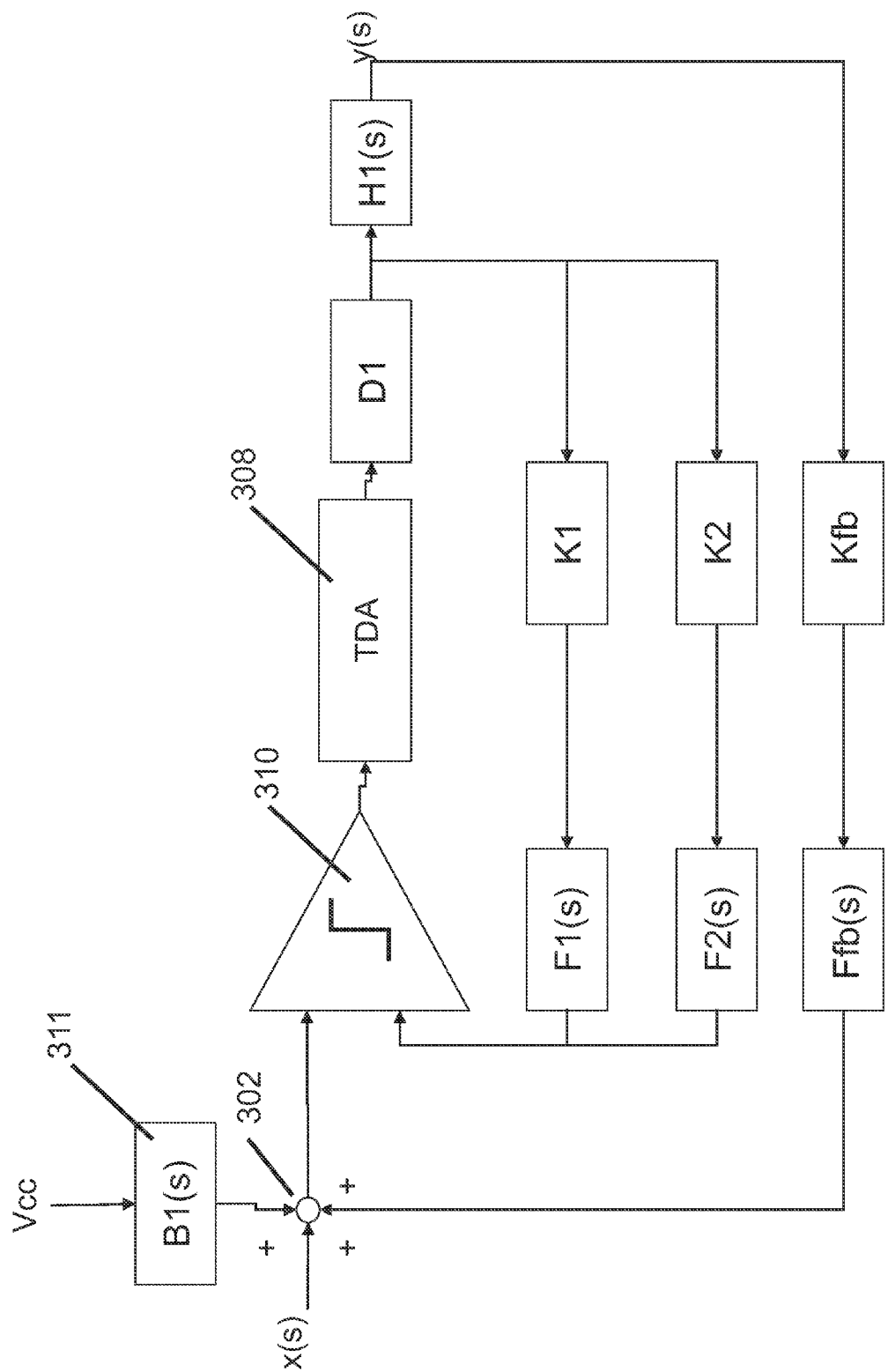
FIG. 3 shows a schematic block diagram of a more complex embodiment of the prior art system shown in FIG. 2.

FIG. 3 also shows a prior art amplifier circuit, which is a more complex embodiment of the circuit in FIG. 2. The FIG. 3 circuit operates with a digitizer 310 having two input signals. One signal input to the digitizer 310 is the sum of three separate signals: (i) an input signal x(s), (ii) a bias signal $B1(s)$ 311, and (iii) the output filter feedback signal Ffb.Kfb.y, such that the input signal to the digitizer is represented by 'x+b+Ffb.Kfb.y'. The other signal input to the digitizer 310 is the output signal of the integrator F1. Output y(s) represents the output signal of the digitizer 310 which has been delayed by a set amount by the TDA block 308. D1 is a DAC. K1 is a divider ratio which sets the gain of the system. F1 is a lossy integrator with roll-off frequency set above the passband but well below the switching frequency. This heavily attenuates the carrier signal. F2 and K2 form a high-pass filter, capacitive differentiator, having a cut-off point well above the passband, thereby shaping the carrier signal to improve the total harmonic distortion and noise (THD+N).

The digitizer 310 ensures that the integrator F1 tracks the input signal 'x+b+Ffb.Kfb.y' to the digitizer 310. This is achieved by the digitizer 310 comparing its two input signals. The digitizer 310 will change state according to the carrier signal component in F1 The carrier signal component in F1 will cause the digitizer 310 to change state as the carrier signal rises above or falls below the digitizer's other input signal, x+b+Ffb.Kfb.y. The system output signal, y(s), which forms part of the digitizer's other input signal has been delayed by the TDA circuit. This y(s) signal, when combined with any delays in the DAC D1, sets the maximum frequency of operation of the system. Similarly to the circuit shown in FIG. 2, in FIG. 3 the signal output from F2 becomes stronger as the signal approaches the voltage rail. This causes the gain of the system to increase slightly, compensating for other non-ideal features. The signal output from Ffb.Kfb assists to correct the error produced by the output filter H1, reducing total harmonic distortion (THD) and output impedance.

Embodiments of the circuit and system of the present disclosure will now be described with reference to the accompanying drawings.

Figure 4:
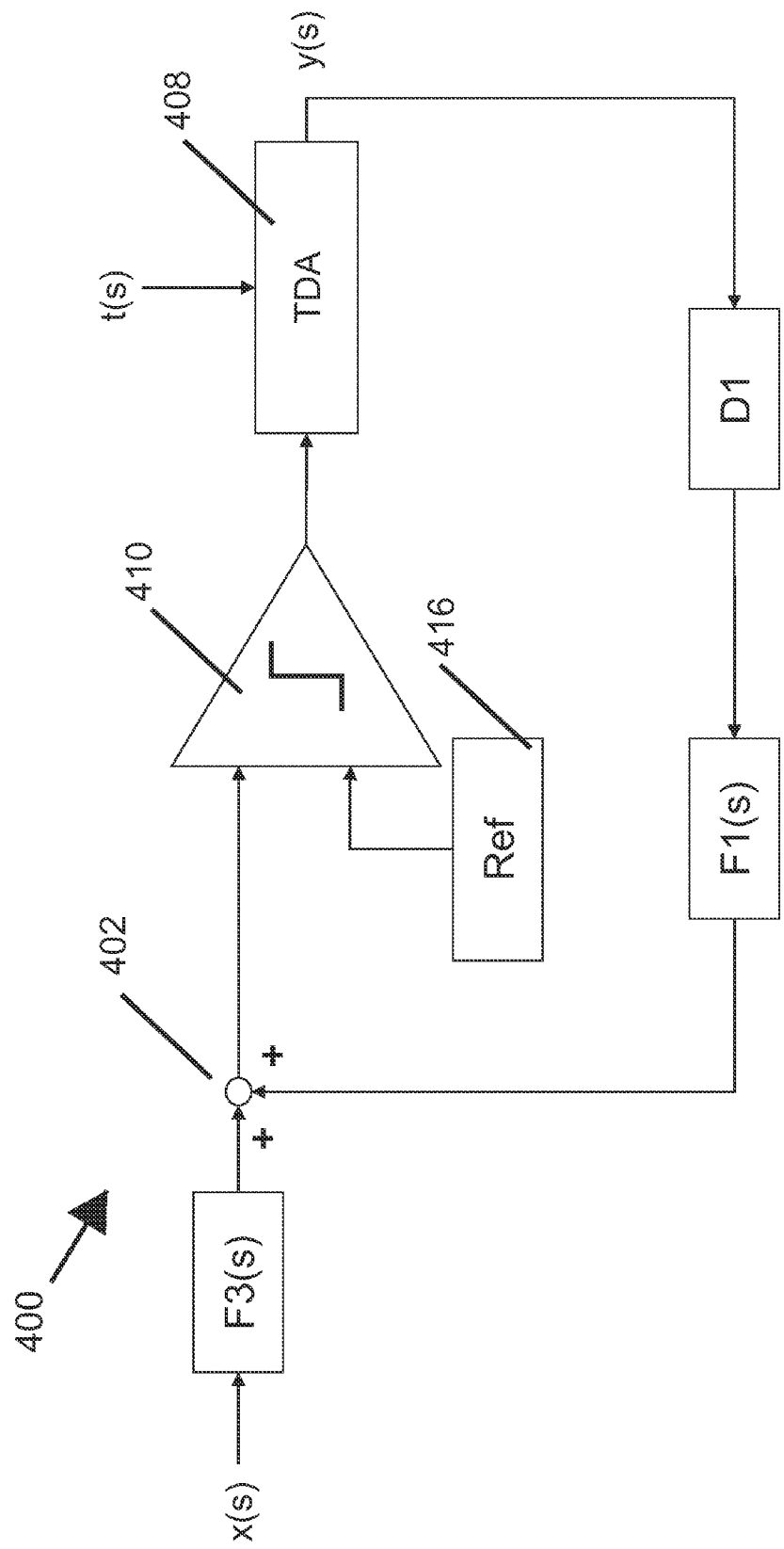
FIG. 4 shows a schematic block diagram illustrating an embodiment of the present disclosure.

FIG. 4 illustrates a schematic block diagram of a circuit 400 according to an embodiment of the present disclosure. During operation of the circuit shown in FIG. 4, a signal x(s) is input to a first signal conditioning function $F3(s)$. $F3(s)$ may be a simple gain or attenuation function, a direct transfer function, or other type of signal pre-conditioning function. For example, for a DAC implementation, $F3(s)$ would be a frequency up-scaling function. The type of function performed would depend on the application of the circuit.

A summing node 402 combines the output of the first integrator $F3(s)$ with a feedback signal. The output signal of the summing node is an input signal to a digitizer 410. The digitizer 410 has two inputs: an inverting input of the digitizer 410 receives the signal output from the summing node 402, and a non-inverting input of the digitizer 410 receives a reference signal 416. The digitizer 410 generates an output signal comprising a series of pulses.

A delayed output signal y(s) is produced when the output signal of the digitizer 410 is delayed by the time delay asynchronous (TDA) block 408. The introduced time delay is application specific, as it depends on many variables. Examples of selection of time delay for a power amplifier, ADC, and DAC embodiments are described as in the following paragraph. Initially, however, for any particular application, a proper delay is introduced to yield the highest THD+N and passband bandwidth. These two figures of merit take into account distortion, noise, and bandwidth. And there is a tradeoff to be made between the two: the lower the bandwidth, the greater the separation between the passband and the carrier, resulting in a lower the THD+N. It is this trade off that hampers conventional delta-sigma systems. These conventional systems have slower carrier speeds than those described herein, and therefore typically include multiple orders to achieve comparable results summarized in this disclosure. The continuous summing sigma circuits of the present disclosure does not employ a sample clock and has fewer restrictions on speed. Therefore, its carrier-frequency-to-passband separation is much improved (regardless of the number of orders).

In a power amplifier, the maximum switching speed is limited by the external hardware. So in this instance, a comparator with a time delay that is approximately four times the inverse of the desired maximum frequency is selected, In an ADC, there is no power output stage, yet there is still a virtual reference formed by the average of the output DAC, which will have a finite maximum frequency, which may be an order of magnitude greater than the power amp example. Another considerations of the ADC is the frequency capabilities of the digital system receiving the time domain encoding. In this example, the time delay may be controlled digitally, and may be varied in real time for optimization of THD as mentioned early.

DACs start in the digital domain. Therefore, the integrator, summing, feedback and of course digitizer and therefore delay are all discrete, digital components. The time delay will again be optimized to reduce THD+N and desired bandwidth.

A delayed signal y(s) passes through a DAC D1 and a second integrator F1 to generate a feedback signal summed at summing node 402. The integrator F1 is in effect an accumulator, which means that the value of the integrator at any given time is a function of the inputs and the integrator 'size' (e.g., its RC time constant in analog terms, or its shifting ration in digital space). Care is taken in the selection of integrator 'size' to best match the rest of the system. In the case of an ADC or amplifier where the digitizer is analog, the integrator dv/dt can have an appreciable impact on decision delay, which in turn interferes with the selected time delay. In DACs, which are theoretically ideal, care is taken to protect against lost signal information and wrap-around conditions, all while ensure that accumulation speeds do not exceed the hardware capabilities. Size of the integrator value (aka carrier strength) is important to a given system's capability. In DACs, it designs should include sufficient bit range to accumulate many times without over flow, with values with the desired minimum precision (i.e., accumulating many 24 bit numbers may take a 32 bit register.). In analog input systems, the carrier should be selected to be large relative to hysteresis and noise signals so as to prevent distortion and noise at the output. Too large of an integrator value can also cause excessive phase delay, interfering with the selected time delay. Too small, and the carrier can saturate at large input modulation—similar to a DAC accumulator clipping. Recall also, in analog systems, tuning a comparator to have a desired time delay based on integrator dv/dt will yield positive effects on THD+N.

Figure 4A:
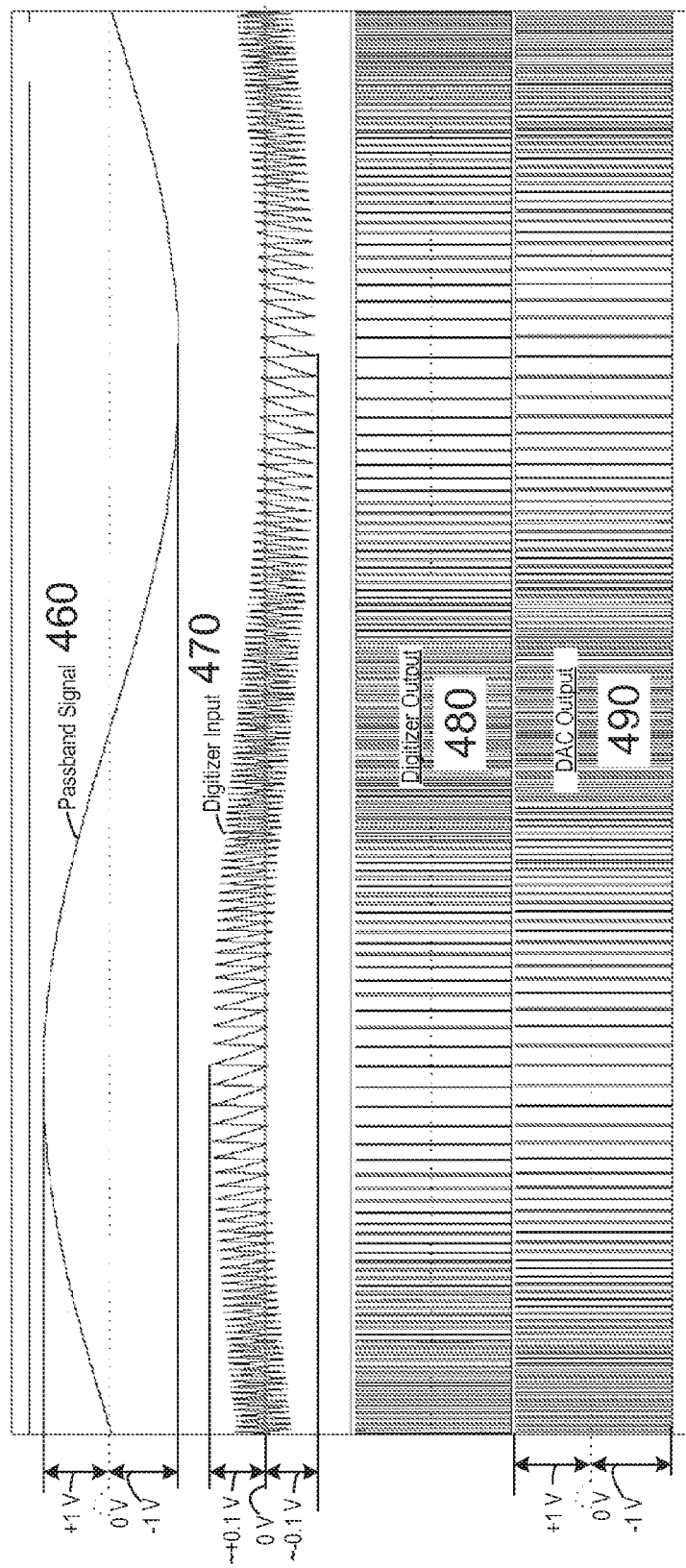
FIG. 4A shows a first series of graphs illustrating voltage waveforms at a number of points in the system depicted in FIG. 4, assuming a lossy integrator.

FIG. 4A provides a series of four traces for different signals produced during operation of the circuit shown in FIG. 4. These traces are described as follows.

The first signal trace of FIG. 4A shows an input signal x(s) filtered through integrator F3 to generate a passband signal component 460. This signal is then summed at summing node 402 with a feedback signal component from the output of integrator F1.

The second signal trace of FIG. 4A shows a resulting multicomponent signal 470 that is output from the summing node 402. This multicomponent digitizer-input signal 470 resembles a ramp function, and is input into the digitizer 410 inverting input. The non-inverting input of the digitizer receives an operating point value, for example a reference voltage. Thus, digitizer 410 is configured as an inverting digitizer for producing negative feedback. In other embodiments, negative feedback may be provided by a non-inverting digitizer in combination with another inverting element, such as a DAC D1 configured for phase inversion, meaning neither a time shift nor a phase shift, but a swap of plus and minus.

The third signal trace of FIG. 4A shows a resulting output 480 of the digitizer 410 produced after it compares its two input signals. Depending on whether the first digitizer input signal is higher or lower than the reference input, the digitizer 410 outputs a signal being either high (1) or low (0) as a result (no voltage levels are shown in the third signal trace because it shows logic levels that are arbitrary binary values). This binary value signal is then delayed an amount of time determined by 't(s)' generated by the time delay-asynchronous circuit (TDA) 408.

The output of the TDA 408 is the system output signal, y(s), i.e., the time domain pulse-width modulated encoded signal of input x(s). Although not shown in FIG. 4A, y(s) is a digital counterpart of the DAC output signal 490 shown in the fourth trace of FIG. 4A. And it is clear that the fourth signal trace is the same signal as the third signal trace, just delayed slightly. In other words, system output signal y(s) drives DAC D1, which scales the binary value outputted by the digitizer to the input signal's (x(s)) domain.

F1 integrates the signal output from D1. The resulting signal output from F1 is a ramp or decaying ramp function. The signal output from F1 is then added at the summing node 402 to the signal output from the reference filter F3. (As an aside, the output signal of F1 is not shown because FIG. 4A represents a functional model. As such, its output node of F1 is not separately, i.e., physically, realized in example implementations, e.g., FIG. 8, used to obtain the present signal traces.) This resulting signal is input to the digitizer 410, so that the encoding cycle continues. It continues because each cycle of the multicomponent digitizer-input signal reaches the operating point value and includes a transitional region having a duration from a peak value (above or below the operating point value) to the operating point value. The duration and polarity of the transitional region are proportional to the amplitude information of the system input signal so as to encode the amplitude information. Thus, the system output signal, y(s), will oscillate, changing its state back and forth depending upon the polarity of the signal output by the digitizer 410 and so that the signal output from the summing node 402 is kept about equal to the operating point value at the reference input 416.

Figure 4B:
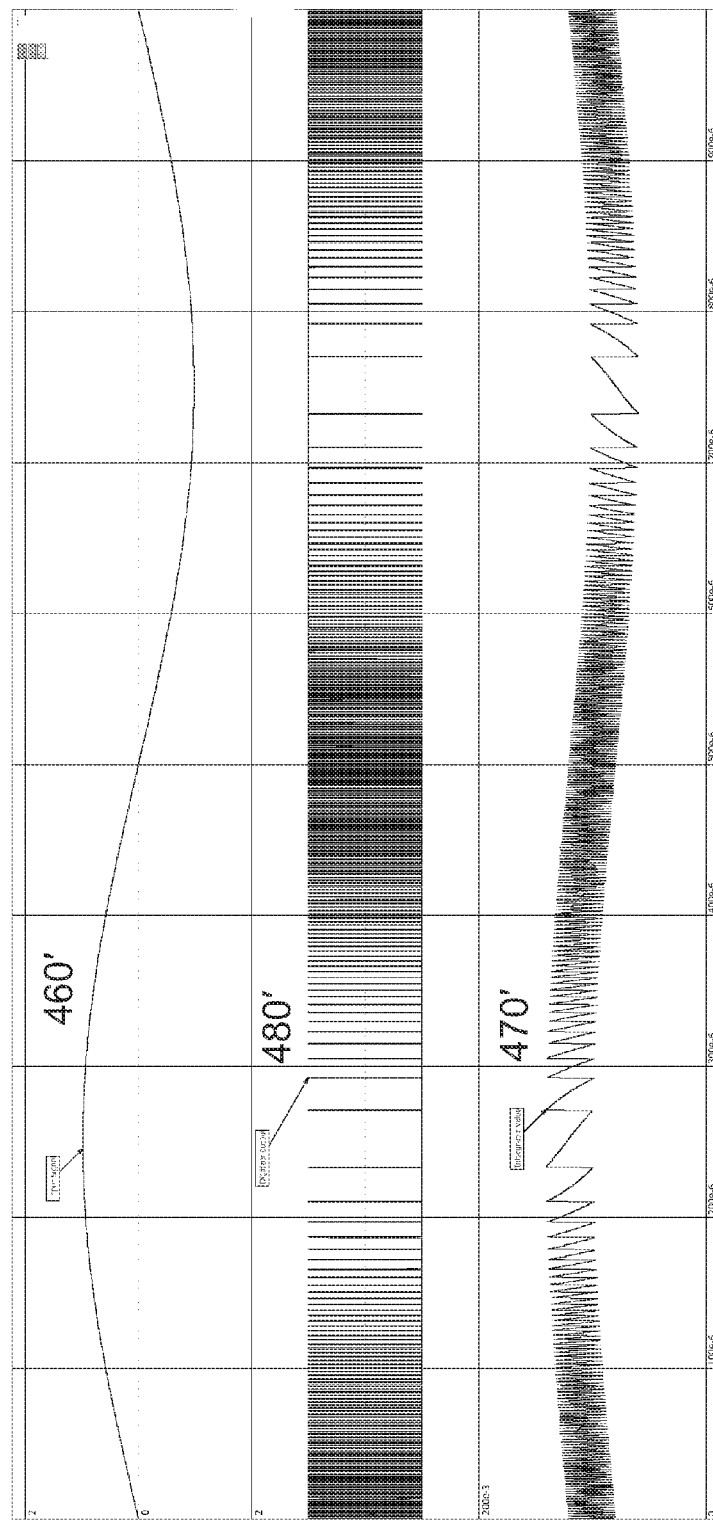
FIG. 4B shows a second series of graphs illustrating voltage waveforms at a number of points in the system depicted in FIG. 4, assuming an ideal integrator.

A passband signal component of signal x(s) is summed with a lossy integral of D1 (output signal of F1), which—for reasons noted in later paragraphs—reduces frequency response issues, and avoids the use of a differential buffer. Lossy integrators have been defined and characterized in International Patent Application Publication No. WO 2013/163691 A1, which is assigned to the applicant of the present disclosure. In short, however, such lossy integrators have deliberate loss parameters that allow for higher over sampling ratios, but without increased costs in terms of power consumption, complexity, or size compared to some conventional systems employing ideal integrators. Nevertheless, an ideal integrator may be used in some embodiments of the present disclosure. And a comparison of carrier signals produced from lossy and ideal integrators may be observed from, respectively, FIGS. 4A and 4B. These drawing figures employ common reference numbers that are denoted with prime symbols when specifically referring to FIG. 4B.

As F1's roll-off frequency is above the passband, it is possible to move integrator F1 to between the summing node and the input of the digitizer, if so desired. The digitizer has two inputs, as previously explained, one is the summed signal 402 of the feedback and input signals, and the other is a reference signal 416, which does not oscillate. The summed signal is the carrier signal that is essentially a sum of the errors. So long as the input signal remains within the allowed domain range and does not clip, the carrier signal will remain approximately stationary. Stationary, in this sense, means that each cycle of the carrier signal reaches the operating point value of the digitizer and that the operating point is essentially uncorrelated to the amplitude information of the system input signal.

This so-called stationary phenomena is clearly illustrated in FIG. 4A, where it can be seen in the first signal trace that the filtered version of x(s) swings between ±1 V, but in the second signal trace the carrier signal stays bounded, or clamped, by its 0 V reference, thus remaining stationary. The signals on these traces have different scale, and have been used to illustrate the nature of the waveforms. As such, the carrier signal in the second waveform (V at 402) varies insignificantly in amplitude as compared to the input signal x(s). The carrier signal oscillates but remains within a narrow band always returning to its 0 V midpoint. This allows for not only full input signal range, but also reduces common mode range specifications on the digitizer. A digitizer (in its simplest form a comparator) can consist of any number of comparators, analog circuits, and other associated logic. The specific arrangement results in limited input swing at the digitizer that facilities simpler digitizer design.

The digitizer output is delayed by an asynchronous delay TDA. The delay can be continuously adjustable by a number of different methods providing an independent way of carrier frequency control and/or carrier modulation. The delay can result from an external signal, t(s). Modulating the delay function modulates the carrier signal and hence the frequency. In another embodiment not shown, integrators F1 and F3 can be combined to integrate both the input signal x(s) and the feedback path simultaneously.

Alternatively, an in another embodiment (not shown) the reference signal may be the complement of the summing node.

The circuit of FIG. 4, and variations described herein, ameliorates a number of problems with the prior art. For example, the ramp response signal of the carrier signal is slower than a step response. That is, the gradient is more gradual in a ramp signal as opposed to almost infinite in a step response. Accordingly, embodiments of the present disclosure reduce the high-speed signal edges and thereby address a common deficiency of prior art systems' components having difficulty processing high-speed edges of signal pulses. Furthermore, the embodiments are clockless and lack differentiating (subtraction) circuitry. For example, the summing node 402 (that is, a node where the signals are summed together) is used rather than a delta node 102 (FIG. 1), that is, a node where one or more signals are subtracted. By summing the signals (as opposed to subtracting them) the present system avoids the use of a differentiator. This is advantageous because this circuit allows for significantly higher oversampling ratios and larger dynamic input range without the costs in power, complexity and size.

Figure 5:
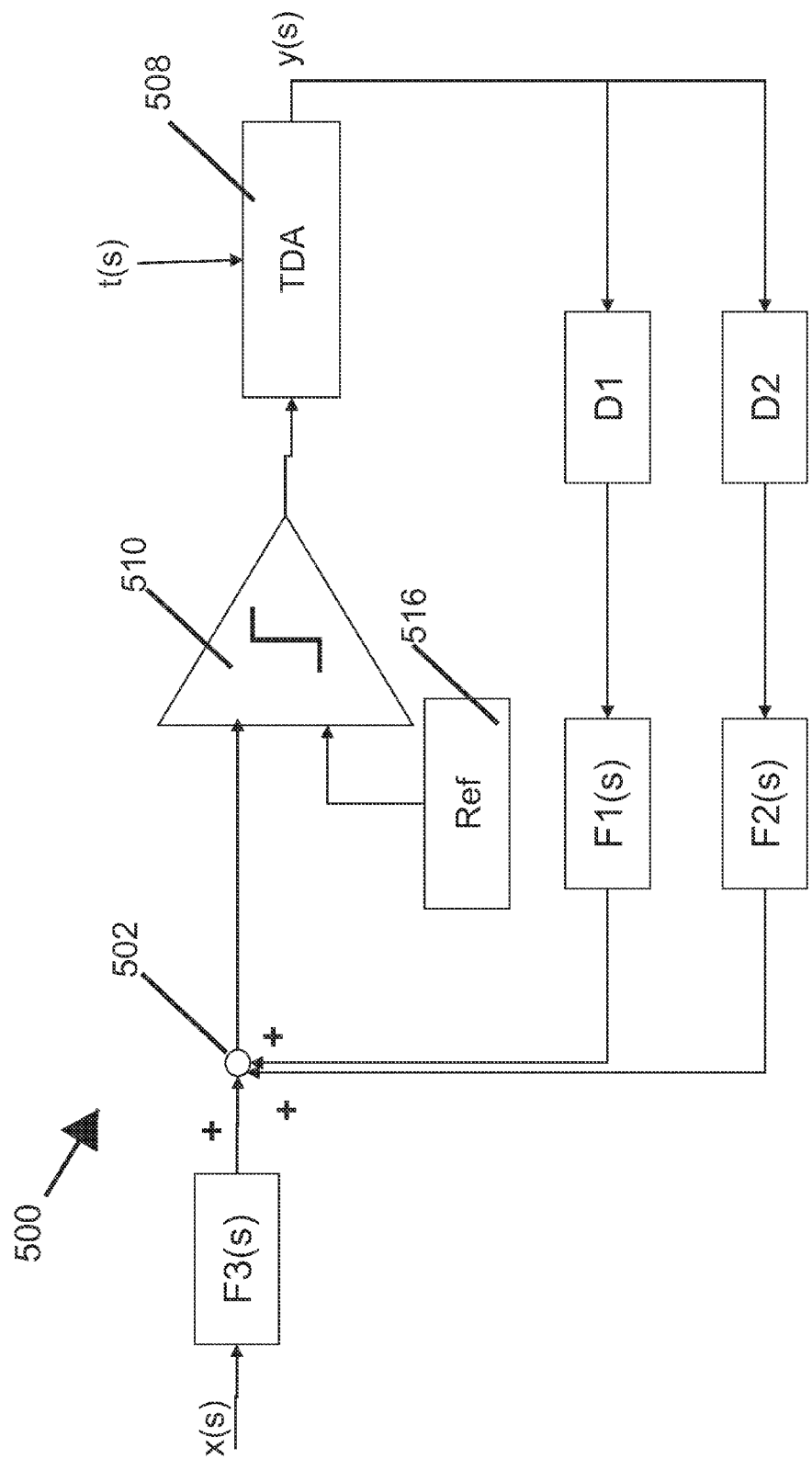
FIG. 5 shows a schematic block diagram illustrating a second embodiment of the present disclosure.

FIG. 5 illustrates a more complex embodiment of the circuit 400 shown in FIG. 4. Circuit 500 operates in a similar manner to the circuit 400, but the circuit 500 has a secondary feedback loop having a DAC D2 and an additional carrier-shaping function F2 (e.g., a differentiator) that allows carder signal shaping, so as to further enhance total harmonic distortion and noise in the system (THD+N). Additional details of the carrier shaping by compression-distortion correction are explained in latter paragraphs with reference to FIGS. 7 and 8. Also note that D1 and D2 are represented in FIG. 5 as two separate functional blocks, however, in some embodiments contemplated by the present disclosure, aspects of functionality afforded by D1 and D2 may be provided by circuitry components common to D1 and D2 (or O2 and O3 of later drawing figures).

Figure 6:
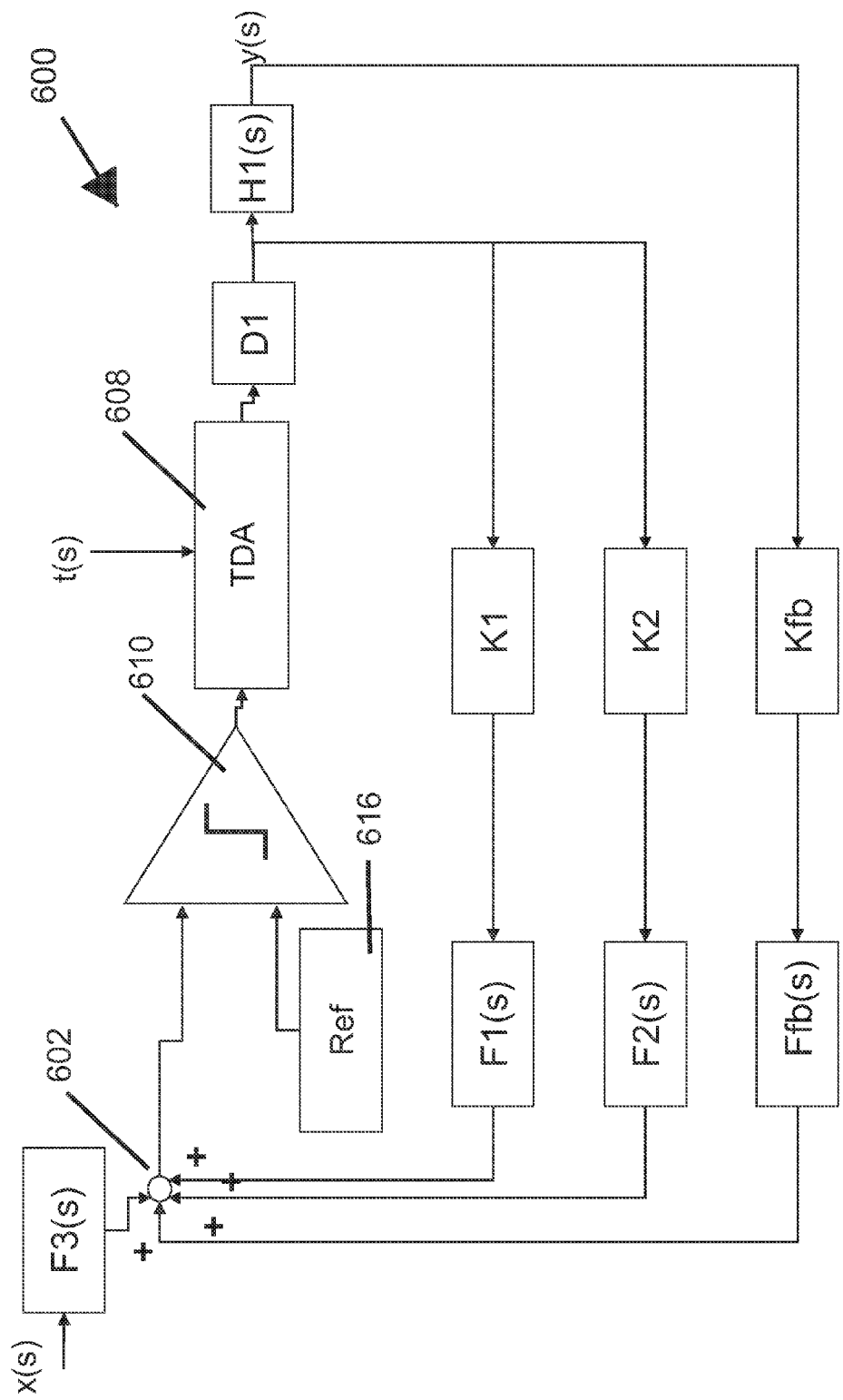
FIG. 6 shows a schematic block diagram illustrating a third embodiment of the present disclosure.

FIG. 6 illustrates a more complex embodiment of the circuit 500 shown in FIG. 5. Initially, circuit 600 appears to be visually similar to that of FIG. 3. But unlike the embodiment of FIG. 3, circuit 600 has a reference voltage defined as the average of the system input signal. In other words, the operating point is uncorrelated to uncorrelated to system input signal.

The circuit 600 of FIG. 6 may be used in an amplifier. In this circuit D1 is a power bridge, K1 is a divider ratio which sets the amplifier gain. H1 is a low pass filter, and Ffb.Kfb provides post-filter feedback to enhance THD+N and reduce output impedance, improving damping factor. In this embodiment, a signal x(s) is input to a first integrator F3(s). A summing node 602 combines the output of the first integrator F3(s) with multiple other signals. The circuit has a digitizer 610 which has two inputs. One input of the digitizer 610 receives the signal output from the summing node 602. The other input of the digitizer 610 (as with other embodiments) receives a reference signal 616. The digitizer 610 generates an output signal comprising a series of pulses. A delayed output signal is produced when the output signal of the digitizer 610 is delayed by the time delay asynchronous (TDA) block 608. The delayed output signal is input to a DAC D1. One of the multiple signals summed at summing node 602 is a feedback signal which results when the delayed signal passes through DAC D1 and a second integrator F1. Another one of the multiple signals summed at summing node 602 is a feedback signal, which results when the delayed signal passes through DAC D1 and a carrier-shaping function F2. As can be seen in FIG. 6, one DAC (for example, D1) can be shared between multiple feedback loops, which suggests that, for carrier-shaping purposes, F2.K2 has the inverse polarity of that of F1.K1 (see e.g., FIG. 8B). The signal output from DAC D1 is also passed through low pass filter H1. The signal output from H1, y(s), is the amplifier output signal. The signal output from H1 is fed back to summing node 602 via a feedback loop with Ffb.Kfb.

Figure 7:
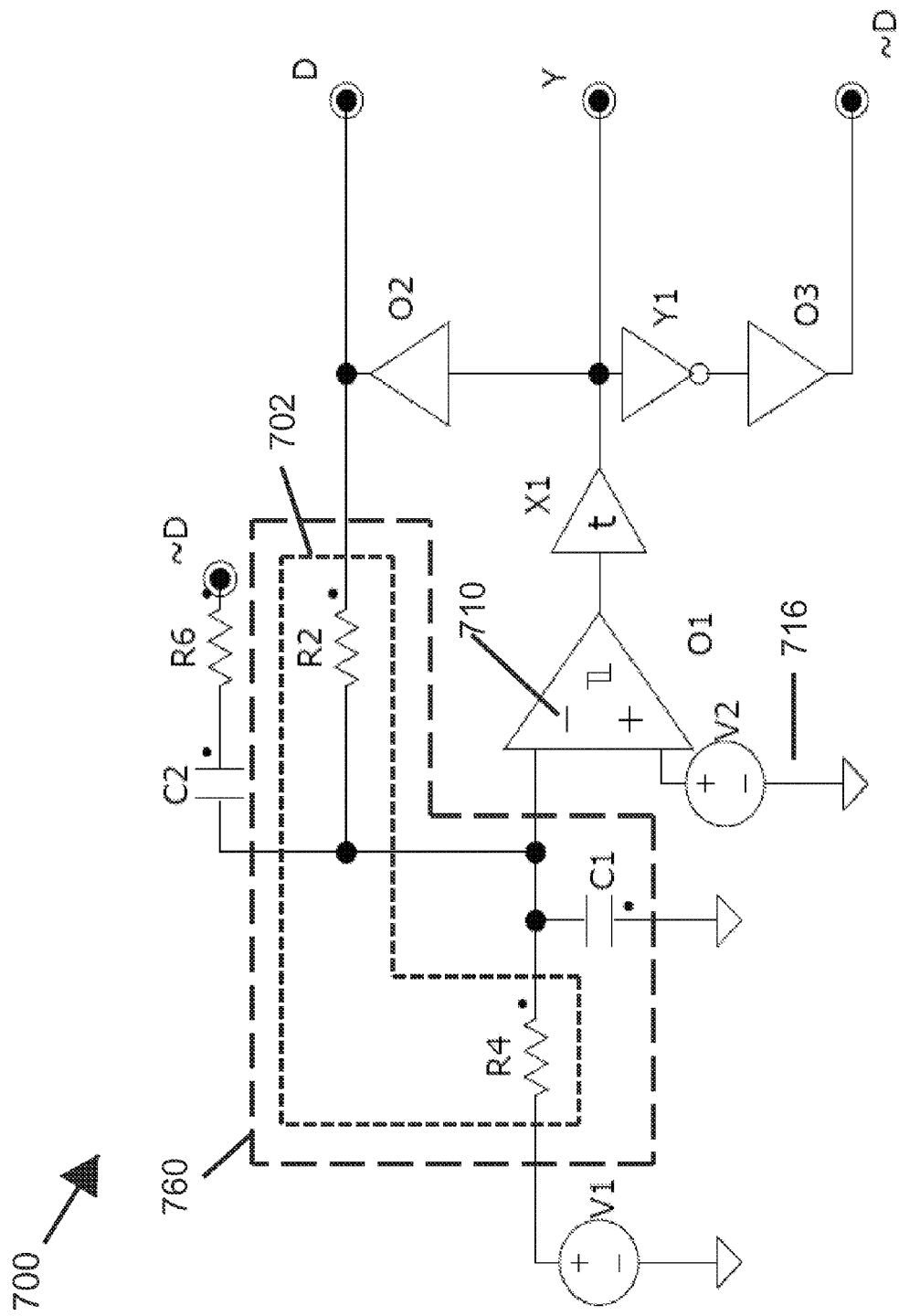
FIG. 7 shows a schematic of a circuit illustrating a fourth embodiment of the present disclosure.

FIG. 7 shows a further embodiment of the present disclosure in a schematic representation of a circuit 700. This circuit is a single ended continuous summing sigma amplifier/coder. Essentially, FIG. 7 is an electrical representation of FIG. 5, that is, a single ended ADC or amplifier. For example, in the FIG. 7 circuit, resistors R4 and R2, and C1 form an integrator 760, in this case a lossy integrator akin to F1 of FIG. 5. R2 and R4 form a passive summing node 702. As can be seen, R2 and R4 sum the signal from the DAC O2 and input signal V1, and combined with C1 form the lossy integrator 760. X1 is the programmable TDA introducing a delay, 't', to the signal.

V2 is a voltage source, but in FIG. 7 V2 is just ground (or zero) and is the reference input 716 to the digitizer (comparator) O1. The comparator O1 works to keep the sum of R2 and R4, and the voltage across C1, at the reference 716, zero. In reality, the comparator keeps the signal as close to zero as possible, therefore the signal value oscillates back and forth around zero, the reference value. FIG. 7 also has a second DAC O3 and an inverter Y1.

In FIG. 7, because R4, R2 and C1 form the integrator, while R2 and R4 form the summing node, the summing node and integrator can be considered to be combined as one element.

The carrier-shaping function F2 of FIGS. 5 and 6 is illustrated by C2/R6 of FIG. 7. FIG. 7 shows the carrier-shaping function F2 embodied as a high-pass filter passing opposing DAC edge information for compression-distortion correction. Additional details of such correction are described in later paragraphs with reference to FIG. 8. Initially, however, it is noted that if C2 and R6 are removed from the embodiment of FIG. 7, then inverter Y1 and DAC O3 may also be removed from the circuit as they are no longer needed after C2 and R6 are removed. Accordingly, removing C2 and R6 (and also Y1 and O3) from the circuit of FIG. 7 equates the circuit diagram to the embodiment shown in FIG. 4, which does not include a carrier-shaping function F2 and therefore lacks compression-distortion correction.

Figure 8:
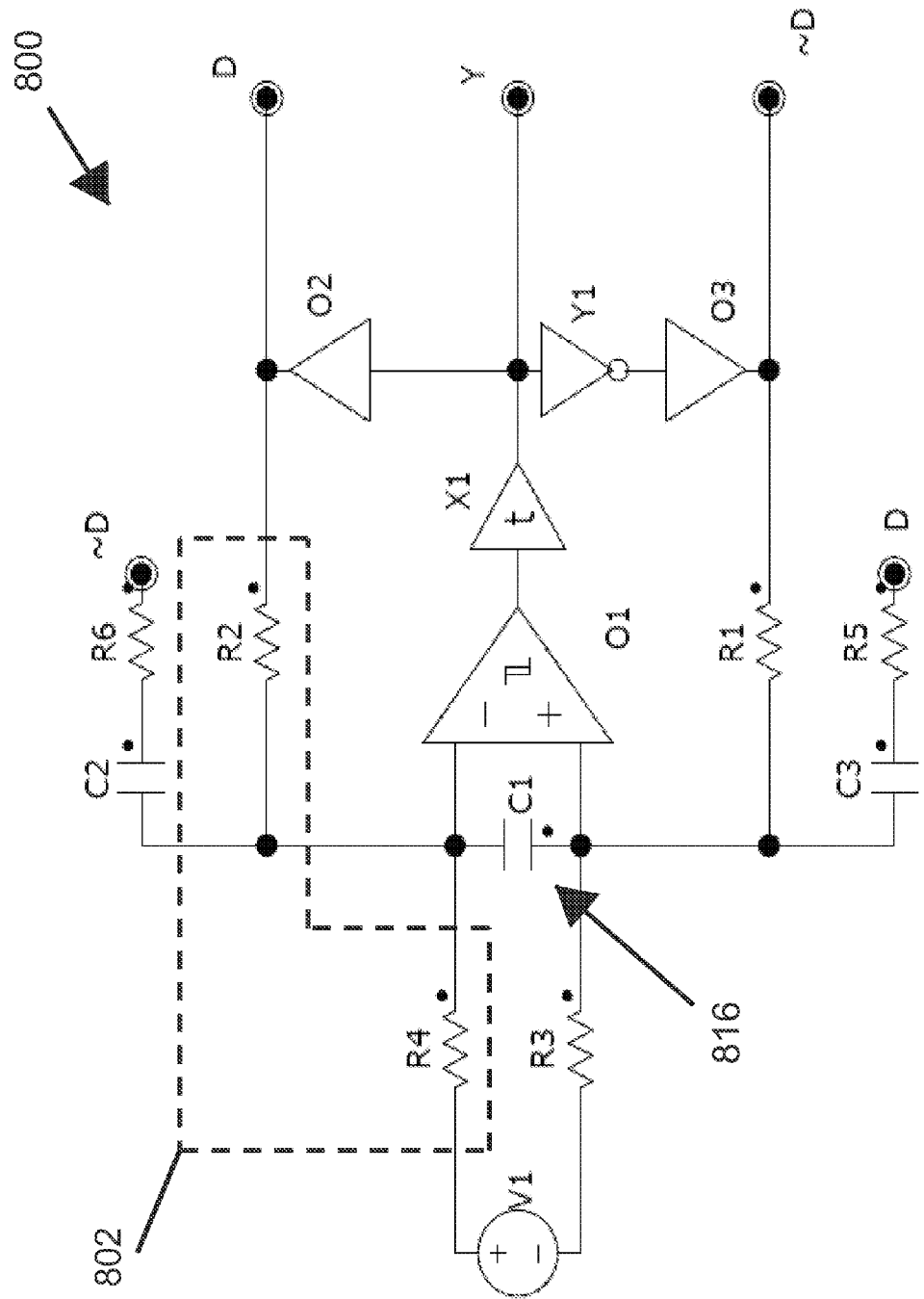
FIG. 8 shows a schematic of a circuit illustrating a fifth embodiment of the present disclosure.

FIG. 8 shows a schematic representation of a full differential, balanced continuous summing sigma amplifier/coder circuit 800. The digitizer in this circuit will be referred to as a comparator. This circuit is symmetrical and uses a differential input x(s), where each half of the input is summed in a single integrator C1 with opposing DACs (e.g., half bridges O2 and O3). One DAC is always the opposite value because of the inverter Y1. The resulting signals of each half of the circuit are then compared at the comparator 810, instead of against a reference. The comparator therefore receives the output of the summing node as one of its inputs and receives a signal that is the compliment of the summing node at the other of its inputs. The rest of the operation of this circuit is identical to the single ended scheme shown in FIGS. 5 and 7. This balanced circuit has the advantage of being self-referenced, and in the case of an analog amplifier, any DAC voltage supply ripple is rejected.

In this circuit, R4 and R2 form a summing circuit 802 to sum a signal output from one DAC O2 and input signal V1. R3 and R1 are the mirror values for the differential input, that is, R3 and R1 form a summing circuit to sum the output of the other DAC O3 and input signal V1. C1 is a lossy integrator. X1 is the programmable TDA, D and ~D for the opposing DACs (O2, O3) feedback a signal via R1/R2 and R5/R6.

FIG. 8 also shows how an operating point value 816 is established as the voltage across the capacitor of C1. Furthermore, C1 is common to both input integrators established by R3/C1 and R4/C1. The use of the single capacitor, C1, common to two differential inputs and balanced feedback paths facilitates a well-balanced system that avoids the use of different capacitors at corresponding comparator inputs. This avoids the use of different capacitors, typically having widely fluctuating operational tolerances, that are generally difficult to precisely balance. Furthermore, the operating point value of input 416 (FIG. 4) can be removed when going to differential input mode. This is because with a full-bridge output, as provided in the circuit of FIG. 8, Vcc ripple is common mode noise, and is therefore naturally rejected by the system.

Figure 8A:
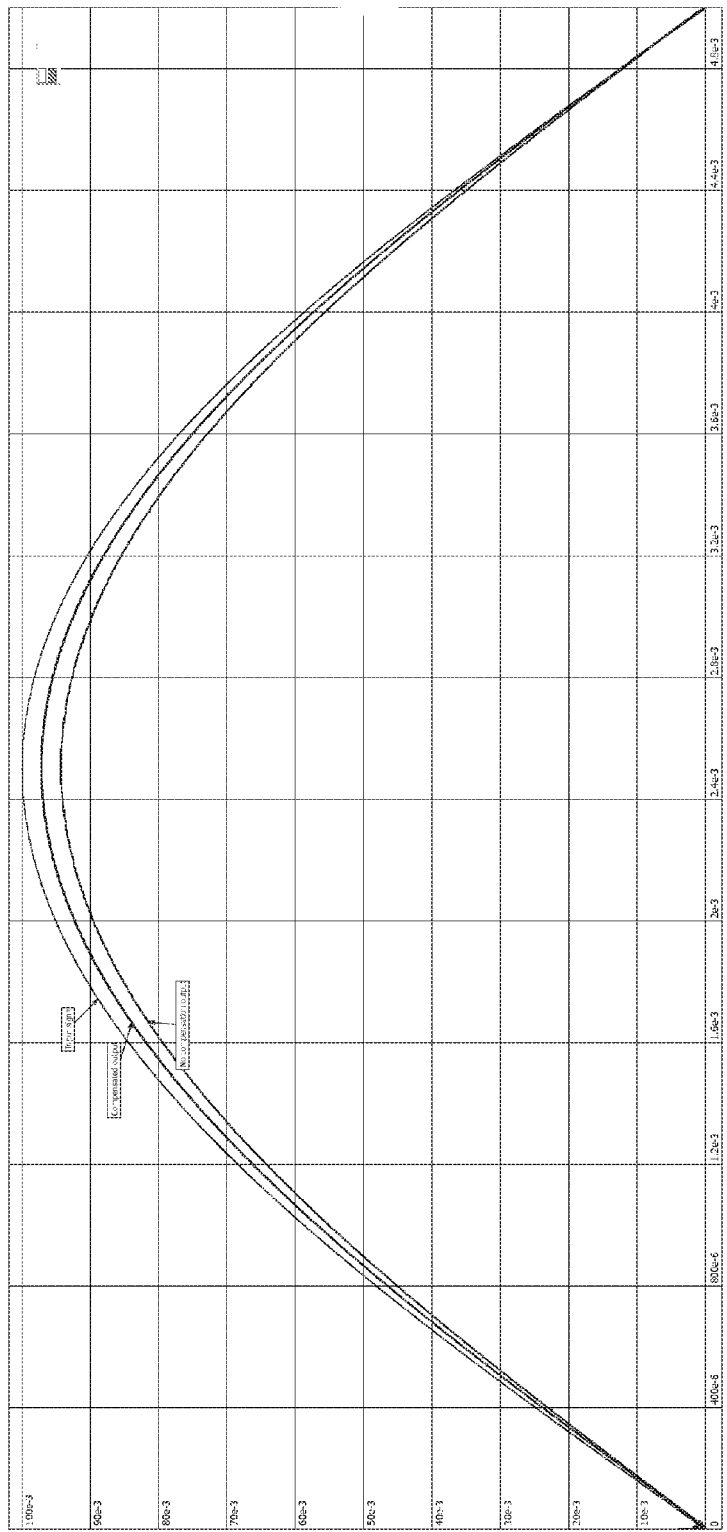
FIG. 8A is a graph showing a peak of a sinusoid system input signal, and its corresponding output results with and without compression-distortion correction achieved with carrier-shaping feedback paths of the embodiments of FIGS. 5-8.

FIG. 8 also shows that the carrier-shaping function in FIGS. 5 and 6 is embodied by C2/R6 and C3/R5 in FIG. 8. Accordingly, as the differential-input counterpart of C2/R6 shown in FIG. 7, the C2/R6 and C3/R5 pairs provide high-pass filters in the form of cross-over feedback paths that pass opposing DAC edge information so as to correct compression distortion, as shown in FIG. 8A. In an amplifier circuit, such as, for example, circuits 700 or 800, carrier-shaping functionality may be achieved with a differentiator.

FIG. 8A shows compression attributable to the feedback error always being proportional, worsening the further from the operating point value of the circuit.

Crossover feedback paths provide compression distortion compensation by offsetting the carrier error proportionally to the distance from the mid-point, and only on one half of the duty cycle with the slow ramp. This results in a carrier that is more true to the original signal than if no compensation were used. One possible example is illustrated in FIGS. 7 and 8, where an RC network (C2&R6) provides the cross-over carrier information. In a digital representation, the equivalent F2 might be a biasing of td such that the slower rising edge spends longer above the input signal, conversely the falling, faster edge has reduced delay. This results in reduced error. Another way to implement this correction, in the case of an Audio amplifier, is where a comparator serves as both the digitizer and time delay. The comparator td can be designed so that it is dV/dT dependent. That is, slow changing voltages have long delays, short have short delays.

Figure 8B:
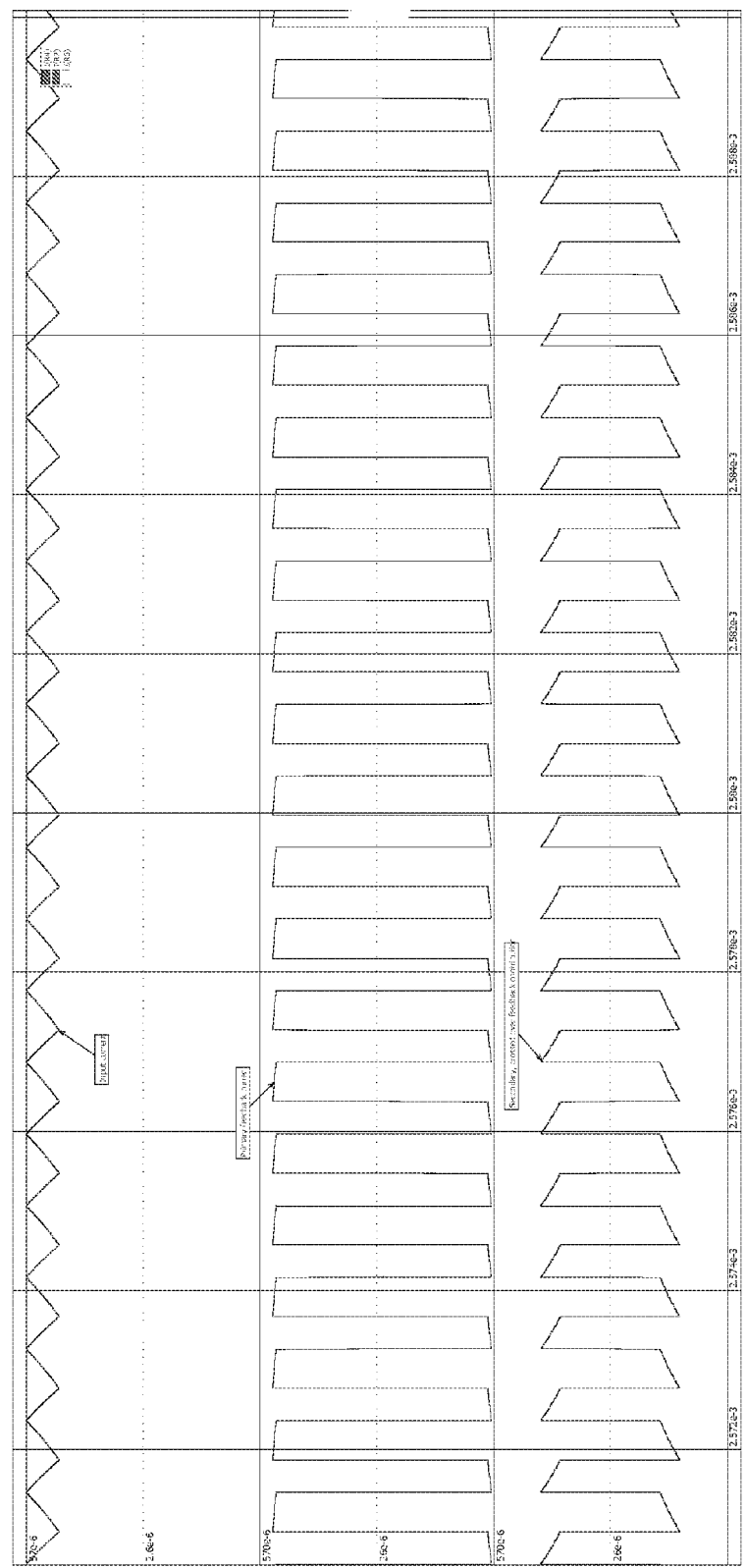
FIG. 8B shows a first series of graphs illustrating electrical current waveforms at a number of points in the system depicted in FIG. 8.

FIG. 8B shows a lossy integrator circuit, as shown in FIG. 8. The time slice is chosen as it is showing the crest of the sine wave. The first trace is the current due to the input signal. The second is the main feedback path found in all base versions, the last is the new additional 'carrier' shaping cross over feedback.

Concentrating on the feedback paths, they are exactly out of phase, as we might expect given that their sources are of opposite polarity of all times. At low modulation, they appear to be roughly identical regardless of which state of the duty cycle the system is in. This is notable, as it implies that the additional feedback has little impact when not needed. But note that it does in fact slow the switching speed down, and reduces noise: as the cross-over provides additional carrier energy to be discharged, the switching frequency slows down (i.e., the comparator takes longer to change its state) and the noise floor improves.

Figure 8C:
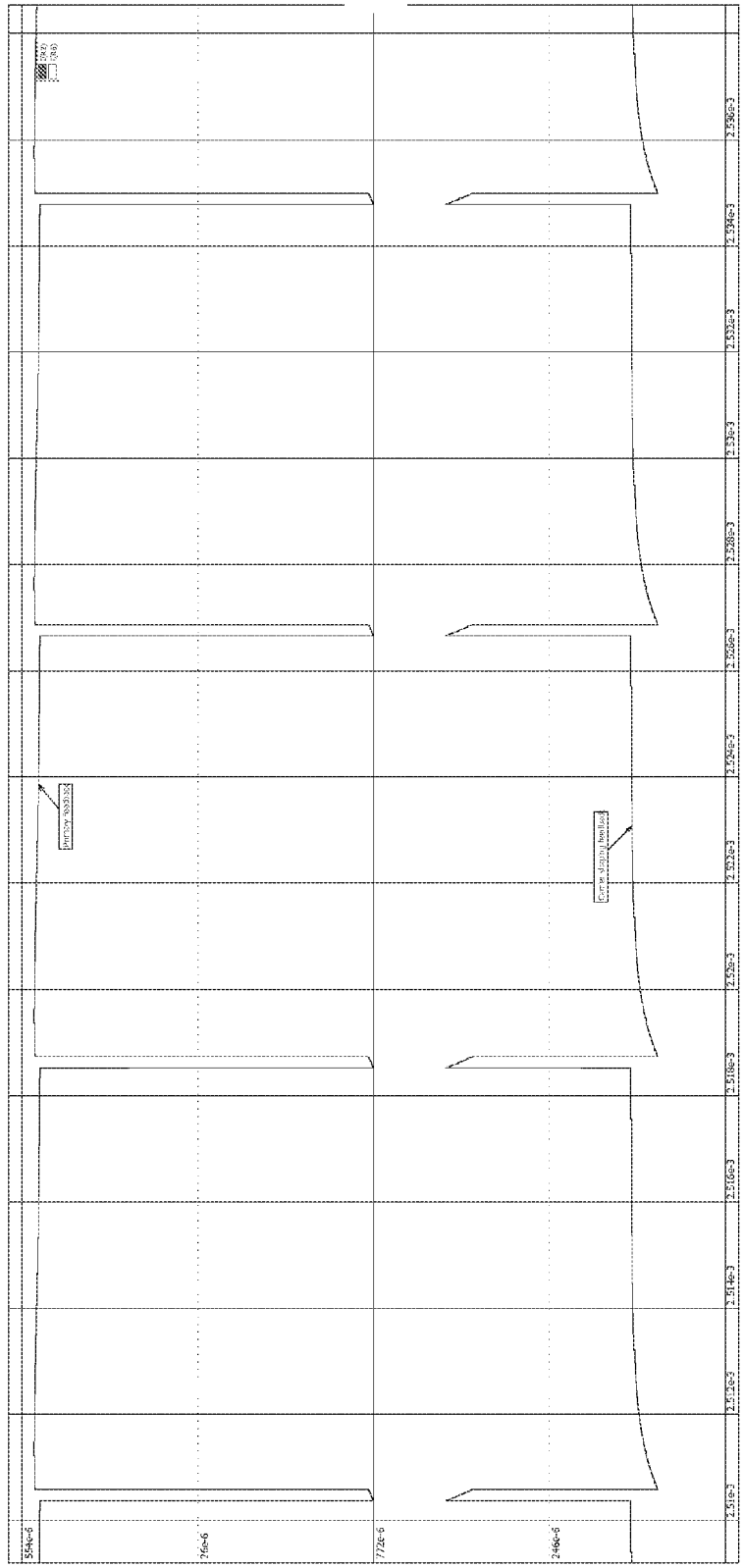
FIG. 8C shows a second series of graphs illustrating electrical current waveforms at a number of points in the system depicted in FIG. 8.

FIG. 8C shows the two feedback paths, but at much higher input signal modulation, hence the greatly different duty cycles. It is easy to see that the second waveform has very strong influence during the short pulse, but very little during the long. This imbalance is what provides the counter-compression behavior, pushing the carrier closer to the ideal.

Figure 9:
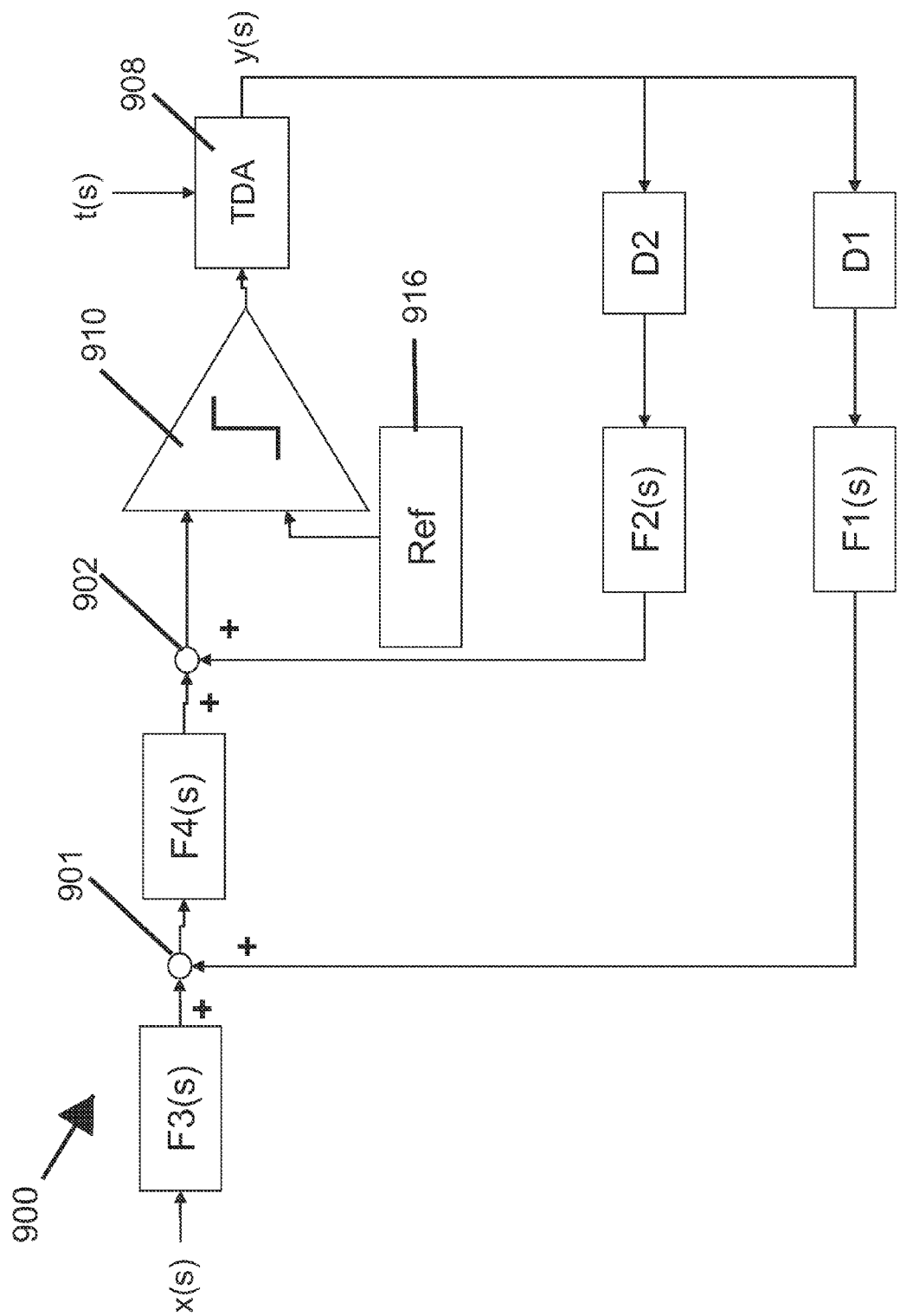
FIG. 9 shows a schematic block diagram illustrating a sixth embodiment of the present disclosure.

FIG. 9 illustrates a schematic block diagram showing a sequential, second order system, whereas other previously described embodiments include single or parallel order systems. For example, the single-order system of FIG. 4 includes a known absolute position error which increases with displacement from a signal mid-point, and is inversely proportional to the carrier to signal oversampling ratio. In other words, the faster the switching, the smaller the carrier error. And FIGS. 5 and 6 show multi-order systems, but the increase in order is parallel. Thus, embodiments of FIGS. 5 and 6 apply corrections for this error with additional feedback (F2(s) in FIG. 5 and F2(s) and F3(s) in FIG. 6) at varying points summed into the same summing node (502 in FIG. 5, 602 in FIG. 6). A purpose of such configurations of FIGS. 5 and 6 is to provide enhanced performance for a given over-sampling rate.

Turning back to the circuit shown in FIG. 9, a first integrator F4 outputs a signal which is summed with a second signal at summing node 902. The output signal which results from summing node 902 is one input signal received by digitizer 910. The other input of digitizer 910 is a reference signal 916. The digitizer 910 outputs a signal which is delayed by TDA 908 resulting in output signal y(s). Output signal y(s) passes through a feedback loop containing a DAC D2 and an integrator F2. The signal output from F2 feeds back into the summing node 902. The output signal y(s) also passes through a separate feedback loop containing a DAC D1 and an integrator F1. The signal output from F1 feeds back into a different summing node 901. An integrator F3 receives an input signal x(s) and produces an output signal. The output signal of F3 is summed with another signal at summing node 901. The output of summing node 901 is input into integrator F4. In other embodiments summing nodes 901 and 902 may sum more than two signals.

Although FIG. 9 shows a sequential, second order system, it can be considered as a cascade of integrators. Similarly to the block diagram shown in FIG. 4, in the block circuit in FIG. 9 the first summing stage 902 can be considered to provide the absolute error signal, combining F1(s) and F3(s). The second summing stage 902 in FIG. 9 combines F2(s) and F4(s) forming the second order part of the system. This provides the first derivative error signal component. The advantage of the approach shown in the circuit illustrated in FIG. 9 is a higher degree of accuracy for a given oversampling ratio.

In other embodiments not shown, the digitizer may have more than one output and may generate more than one output signal.

This process of increasing the order of the system can be repeated to any order necessary to suit the application, although care needs to be taken to ensure stability as the order of the system increases.

Figure 10:
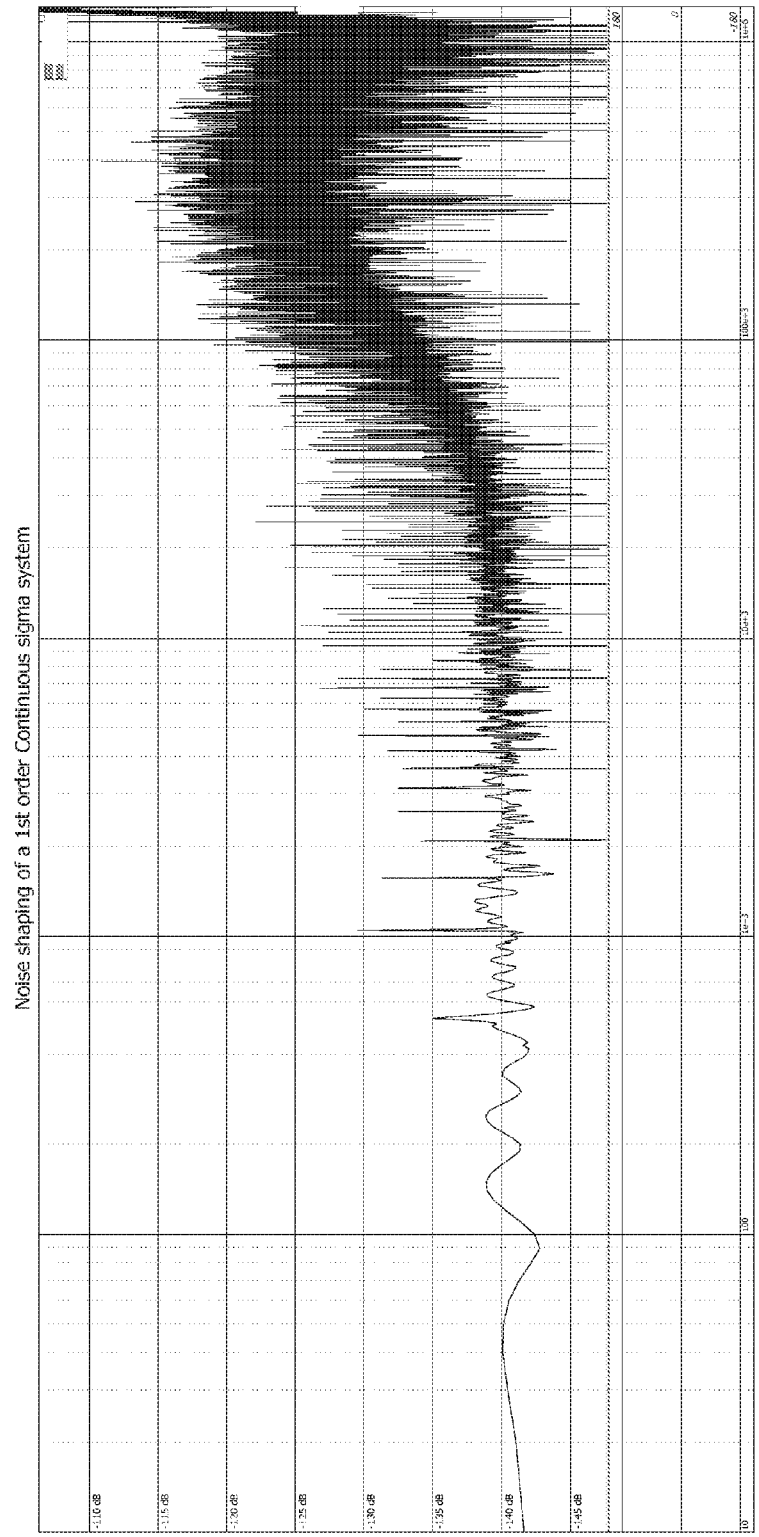
FIG. 10 is graph showing noise shaping capabilities of the embodiment of FIG. 4.

FIG. 10 shows an example frequency response plot of a first-order lossy integrator system, according to the present disclosure. The flat plateau in the passband ends at the single-pole roll-off frequency, which in this example is about at 30 kHz. At this point, the noise can be seen increasing until it reaches the roll-off frequency of a lowpass, demodulating, output filter (which is present in the example plot because it was needed to generate the plot and address Fast Fourier Transform aliasing artifacts generated during the simulation.) The sharp climb from there 500 kHz increases until it hits the carrier, which in this instance is stable as there is no input signal, i.e., with no modulation, the carrier frequency will sit stable at 1/(4*time delay). The noise climb from the passband is 20 dB per decade as it is only a first order. The plot shows that despite the single order, the passband noise is very low, due to the clockless nature of the continuous summing sigma having improved frequency separation of between its carrier and passband,

SUPPLEMENTAL SUMMARY OF ADVANTAGES

Normally, converters work across a broad analog range (a common mode or common voltage range). However, the operation of disclosed circuitry need not work across such a broad range because the carrier signal is approximately stationary—it hardly moves. Therefore, although clipping can still occur, clipping is at a much larger value. The comparator need not be broad ranging by design. This is an improvement of the present disclosure over the circuits shown in FIGS. 2 and 3. In FIGS. 2 and 3 the carrier signal fluctuates. The carrier signal depended on the signal that was input into the system. The present disclosure as described above and in FIGS. 4 to 8 shows that the input signal is effectively cancelled out. In FIGS. 4 to 8, the output and input signal come together, the comparator switches to ensure that the sum of the two signals (input and output) remains approximately stationary, hence the carrier signal is also approximately stationary. The carrier signal remains stationary when the equal and opposite input and output signals are summed. Therefore, the cancelling of the input signal produces the variation in the carrier signal. To cancel that signal the DAC must have the negative of exactly the same signal, so the signal can be obtained by the inverse of the DAC signal.

In the circuits of FIGS. 2 and 3 there is a single carrier signal on one of the inputs of the digitizer. In the present disclosure the carrier signal is present in both inputs of the digitizer but in opposite directions. The circuit of the present disclosure advantageously is fairly jitter immune.

FIG. 8 is symmetrical and therefore it has a differential and balanced input. The circuits shown in FIGS. 2 and 3 could be made to be differential and balanced, however, they would employ a number of operational amplifiers and this adds significant hardware to the circuits, which adds significant cost to the circuits. The circuit of FIG. 8 is fully differential and balanced without any amplifiers and the signal is input directly into the comparator.

The ADC section of the present disclosure (sigma system) uses a comparator as an input to bypass issues about input amplifier linearity. In addition, the signal presented to the input of this comparator has a triangular shape with a declining response to higher frequencies. Having a triangular wave means that the system does not have significant issues when the signal is integrated, unlike when a step or square wave signal is used. Additionally, having mitigated the speed limits mentioned, this system can exceed the oversampling rates of traditional delta sigma converters by orders of magnitude. This offsets the number of orders previously used to achieve the same performance, and hence reduces the number of components and reduces the cost of the system. The delay element in embodiments of the present disclosure is used as a component which sets the operating frequency of the modulator.

The sample rate of discrete time DS ADCs is limited because of the analog complexity and power consumption issues. This is not an issue in embodiments of the present disclosure.

An additional advantage that embodiments of the present disclosure have over the prior art DS system is the input signal range. Due to the differentiation input component used in prior art systems, the DS input signal cannot exceed half the range available because this will cause saturation. Conversely, embodiments of the present disclosure have full input range, which provides 6 dB of additional signal range over the noise floor.

Embodiments of the present disclosure differ from the prior art circuits shown in FIGS. 2 and 3 in how the carrier signal behaves at the digitizer. The carrier signal in FIGS. 2 and 3 will oscillate about the input signal, tracking the input because the digitizer inputs are the system input and feedback signals.

In contrast, the carrier signal in embodiments of the present disclosure is contained in the signal output from sum of the feedback and input signals, which means that the carrier will remain 'stationary' as long as the input signal remains within the allowed domain range, that is, it does not dip. This allows for very specific digitizer input configurations, resulting in significant performance improvements such as (but not limited to) finer precision differentiation at the desired carrier average value, and optimized voltage supply ripple rejection (VSRR).

Skilled persons will understand that many changes may be made to the details of the above-described embodiments without departing from the underlying principles of the invention. The scope of the present invention should, therefore, be determined only by the following claims.

The invention claimed is:

1. A method of asynchronously encoding amplitude information of a system input signal into time-sequence information of a pulse-width modulated system output signal, the method comprising:
    establishing at a digitizer an operating point value as an average amplitude of the system input signal;
    applying to the digitizer a multicomponent digitizer-input signal corresponding to a sum of a passband signal component and a feedback signal component to produce a pulse-width modulated digitizer output signal representing the system input signal;
    introducing an asynchronous time delay to the pulse-width modulated digitizer output signal to produce the pulse-width modulated system output signal;
    performing digital to analog conversion (DAC) to the pulse-width modulated system output signal to produce a DAC output signal; and
    integrating the DAC output signal or its summation with the passband signal component to produce the feedback signal component, in which the feedback signal component has an opposite polarity to that of the multicomponent digitizer-input signal that, for each cycle of the multicomponent digitizer-input signal, reaches the operating point value and includes a transitional region having a duration and a polarity between the operating point value and a peak value of the transitional region, the duration being proportional to and the polarity matching that of the amplitude information of the system input signal so as to encode the amplitude information.

2. The method of claim 1, in which the system input signal comprises a differential input signal having a positive component and a negative component, the method further comprising establishing the operating point value by providing the positive component to an inverting input of the digitizer and by providing the negative component to a non-inverting input of the digitizer.

3. The method of claim 1, in which the system input signal comprises a single-ended input signal, the method further comprising establishing the operating point value by providing the single-ended input signal to an inverting input of the digitizer.

4. The method of claim 1, in which the digitizer comprises a comparator configured to provide phase inversion of the multicomponent digitizer-input signal.

5. The method of claim 1, further comprising introducing the asynchronous time delay by adjusting a digital controller configured to produce a selectable time delay.

6. The method of claim 1, further comprising introducing the asynchronous time delay through a propagation delay of the digitizer.

7. The method of claim 1, further comprising:
taking a derivative of the DAC output signal to obtain a counter-compression feedback signal component; and
summing the counter-compression feedback signal component and the feedback signal component to reduce compression distortion of the multicomponent digitizer-input signal.

8. The method of claim 1, in which the passband signal component comprises a first passband signal component, the feedback signal component comprises a first feedback signal component, the method further comprising:
generating second passband and second feedback signal components; and
integrating the sum of the second passband and second feedback signal components to generate the first passband signal component so as to produce a second order multicomponent digitizer-input signal.

9. Electrical circuitry configured to perform a method of claim 1.

10. Electrical circuitry for asynchronously encoding amplitude information of a system input signal into time-sequence information of a pulse-width modulated system output signal, the electrical circuitry comprising:
a digitizer configured to maintain an operating point value as an average amplitude of the system input signal, and configured to receive a multicomponent digitizer-input signal corresponding to a sum of a passband signal component and a feedback signal component to produce a pulse-width modulated digitizer output signal representing the system input signal;
an asynchronous time delay device to delay the pulse-width modulated digitizer output signal and thereby produce the pulse-width modulated system output signal;
a digital to analog converter (DAC) configured to receive the pulse-width modulated system output signal and produce a DAC output signal; and
an integrator configured to integrate the DAC output signal or its summation with the passband signal component to produce the feedback signal component, in which the feedback signal component having an opposite polarity to the polarity of the multicomponent digitizer-input signal that, for each cycle of the multicomponent digitizer-input signal, reaches the operating point value and includes a transitional region having a duration and a polarity between the operating point value and a peak value of the transitional region, the duration being proportional to and the polarity matching that of the amplitude information of the system input signal so as to encode the amplitude information.

11. The electrical circuitry of claim 10, in which the digitizer is configured as a fully balanced differential comparator.

12. The electrical circuitry of claim 10, in which the system input signal comprises a single-ended input signal.

13. The electrical circuitry of claim 10, in which the digitizer comprises an inverting digitizer.

14. The electrical circuitry of claim 10, further comprising a passive summing node configured to receive the feedback signal component and the passband signal component.

15. The electrical circuitry of claim 10, further comprising a digital controller configured to produce a selectable time delay.

16. The electrical circuitry of claim 10, further comprising: comprising a differentiator configured to receive the DAC output signal to produce a counter-compression feedback signal component for adding to the feedback signal component and thereby reducing compression distortion of the multicomponent digitizer-input signal.

17. The electrical circuitry of claim 10, in which the passband signal component comprises a first passband signal component, the feedback signal component comprises a first feedback signal component, and the integrator comprising a first integrator, the electrical circuitry further comprising a second integrator configured to receive the sum of second passband and feedback signal components to generate the first passband signal component so as to produce a second order multicomponent digitizer-input signal.

* * * * *